US011159007B2

(12) United States Patent
Morich

(10) Patent No.: US 11,159,007 B2
(45) Date of Patent: Oct. 26, 2021

(54) ELECTRIC CIRCUIT DEVICE WITH A RESIDUAL CURRENT MONITORING MODULE FOR DETECTING A CLOSED SWITCH CONTACT AS WELL AS A PROTECTION GROUND CONDUCTOR INTERRUPTION IN A ONE OR MULTIPHASE ELECTRIC SUPPLY LINE

(71) Applicant: Bender GmbH & Co. KG, Gruenberg (DE)

(72) Inventor: Lars Morich, Elz (DE)

(73) Assignee: Bender GmbH & Co. KG, Gruenberg (DE)

( * ) Notice: Subject to any disclaimer, the term of this patent is extended or adjusted under 35 U.S.C. 154(b) by 0 days.

(21) Appl. No.: 16/745,658

(22) Filed: Jan. 17, 2020

(65) Prior Publication Data

US 2020/0235562 A1   Jul. 23, 2020

(30) Foreign Application Priority Data

Jan. 23, 2019   (DE) .................... 10 2019 101 636.3

(51) Int. Cl.
*H02H 3/347* (2006.01)
*H02H 3/33* (2006.01)
*H01H 83/22* (2006.01)

(52) U.S. Cl.
CPC ............ *H02H 3/33* (2013.01); *H01H 83/226* (2013.01); *H02H 3/347* (2013.01)

(58) Field of Classification Search
CPC .......... H02H 3/33; H02H 3/253; H02H 3/347; H02H 3/334; H02H 3/162; H01H 83/226;
(Continued)

(56) References Cited

U.S. PATENT DOCUMENTS 5,231,309 A * 7/1993 Soma ................. G03G 15/80
                                                       307/125
2011/0122536 A1   5/2011 Watanabe et al.
2020/0350757 A1* 11/2020 Wu ...................... H02H 3/335

FOREIGN PATENT DOCUMENTS

DE   102009034887 A1   2/2011
DE   102011082941 A1   3/2013
(Continued)

OTHER PUBLICATIONS

Armin, Gaul. Machine translation of patent DE102009034887. pp. 1-13. (Year: 2009).*

*Primary Examiner* — Peter M Novak
(74) *Attorney, Agent, or Firm* — Dickinson Wright PLLC; Andrew D. Dorisio

(57) ABSTRACT

An electric circuit device and method is for recognizing a closed switch contact as well as a protective ground conductor interruption in a one- or multiphase electric supply line. A control of a residual current monitoring device (RCMB control) includes one fault current control unit for generating a control signal pattern including a series of switching-on impulses forwarded to a first electronic switch unit to activate a possible artificial passive fault current on one or more active conductors and the protective ground conductor (as a return conductor), this fault current actually flowing, being recognized, and evaluated in a closed circuit in a closed switch contact to be tested and an intact protective conductor. Owing to control signal patterns varying during monitoring, a reliable detection of the artificial passive fault current is ensured even in large dynamic disturbance levels while the electric installation (supply line) to be monitored is in operation.

13 Claims, 6 Drawing Sheets

Figure 1:
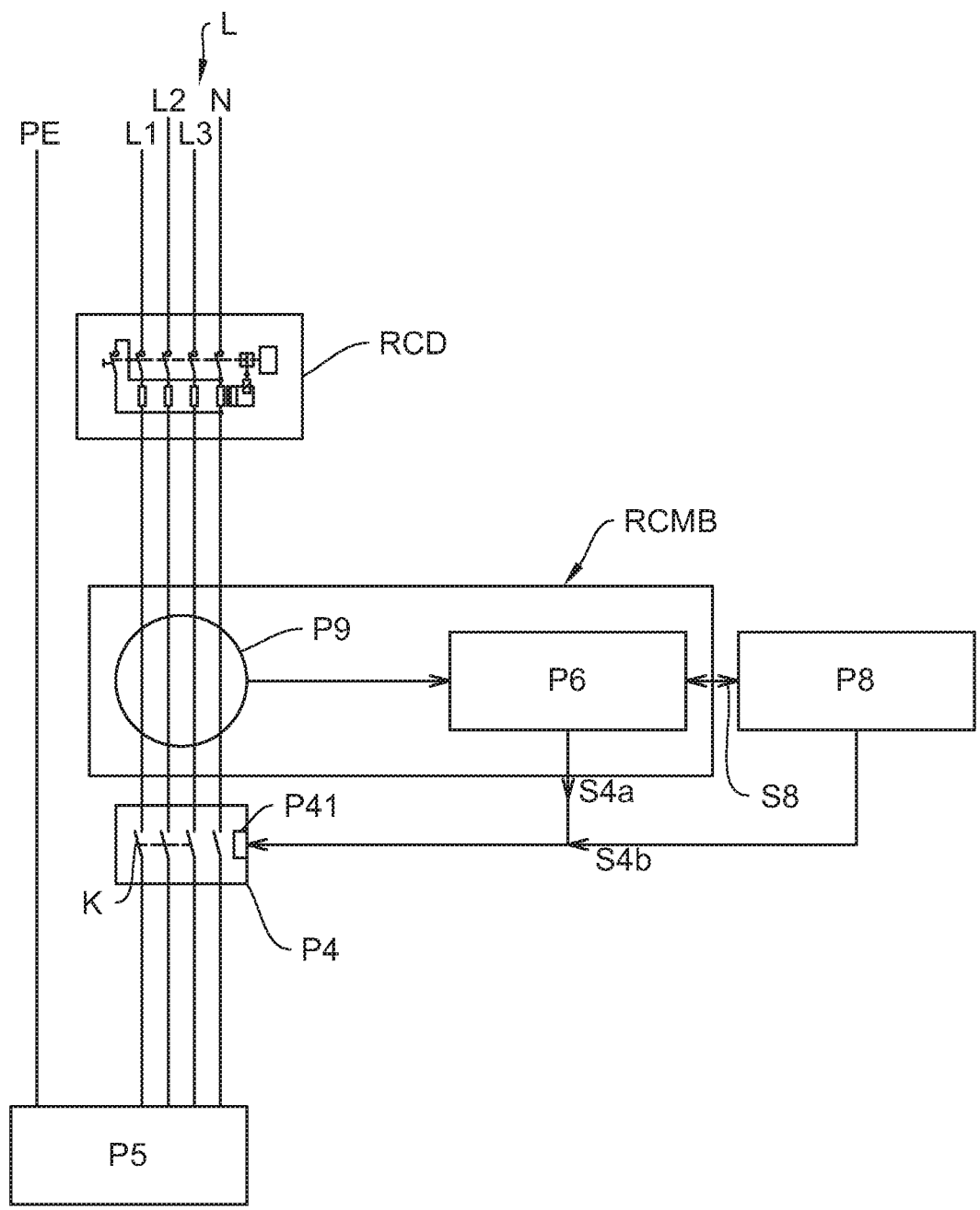

(58) Field of Classification Search
CPC .......... B60L 53/30; B60L 3/04; B60L 3/0069; G01R 31/3277; G01R 31/327; G01R 31/00
See application file for complete search history.

(56) References Cited

FOREIGN PATENT DOCUMENTS

| | | |
|---|---|---|
| DE | 102013207141 A1 | 10/2014 |
| DE | 102013225946 A1 | 6/2015 |
| JP | 2015154641 A | 8/2015 |
| WO | 2011112510 A2 | 9/2011 |
| WO | 2012104703 A1 | 8/2012 |

* cited by examiner

State of the art a)

b)

c)

d)

ELECTRIC CIRCUIT DEVICE WITH A RESIDUAL CURRENT MONITORING MODULE FOR DETECTING A CLOSED SWITCH CONTACT AS WELL AS A PROTECTION GROUND CONDUCTOR INTERRUPTION IN A ONE OR MULTIPHASE ELECTRIC SUPPLY LINE

This application claims the benefit of German Patent Application No. DE 10 2019 101 636.3, filed Jan. 23, 2019, the disclosure of which is incorporated herein by reference.

TECHNICAL FIELD

The invention relates to an electric circuit device and a method for recognizing a closed switch contact as well as a protective ground conductor interruption in a one or multiphase electric supply line.

BACKGROUND

Electric supply lines, consisting of one or more phase conductors and a neutral conductor as active conductors as well as a protective ground conductor, are often equipped with separators to separate a user from the mains infrastructure.

These separators commonly comprise switch contacts (relays) that tend to not open reliably—i.e. they tend to "stick"—under certain operating conditions, e.g. due to high inrush currents, and thus risking that the user is not safely separated from the mains.

Therefore, switch contacts, whose functional opening must be monitored, are installed in charging cables for mode 2 charging and charging stations. This monitoring is performed for each phase conductor (phase) in multiphase supply lines.

A further source of defect is the interruption of the protective ground conductor connection. In this case, an installed fault current protective device (RCD), in particular when charging an electric vehicle, can no longer provide sufficient electric safety. Monitoring an intact protective ground conductor connection is therefore urgently recommended.

From the state of the art it is known that one or more electrically isolated test systems are installed for monitoring a proper opening of switch contacts in the overall electric system for each phase, the electrically isolated test systems detecting the mains voltage and forwarding the result to a superordinate system control via an evaluation logic. However, the number of required components, the amount of required space and electric power as well as the amount of cabling and the costs are substantial. Auxiliary relays for each phase on a DIN rail also pose an elaborate alternative solution.

Measures ensuring an increased safety of the electric system via continuous protective ground conductor monitoring are currently not employed in charging systems.

SUMMARY

The object of the invention at hand is therefore to adopt technical measures which reliably monitor a functional opening of a switch contact and a protective ground conductor connection.

This object is attained by an electric circuit device for recognizing a closed switch contact and a protective ground conductor interruption in a one- or multiphase electric supply line having active conductors and a protective ground conductor.

Using a residual current monitoring module (RCMB) for monitoring fault currents, which are caused by a ground fault, for example, is known from the state of the art, the residual current monitoring module (RCMB) comprising a control (RCMB control) for evaluating a measuring signal supplied by a measuring current transformer and for generating a (first) switching-off signal. The measuring current transformer detects a fault current arising on the supply line as residual current.

Furthermore, coupling the residual current monitoring module to a switching-off device has been known which causes the active conductors of the supply line to be separated.

A superordinate system control has also been known to be available which forwards a second switching-off signal to the switching-off device as an alternative measure or in addition to the residual current monitoring module. The control of the residual current monitoring module informs the superordinate system control on the occurrence of a fault current via a fault signal.

According to the invention, the control of the residual current monitoring device (RCMB control) is enhanced to the extent that it comprises a fault current control unit for generating a control signal pattern. The control signal pattern consists of a series of switching-on impulses which are forwarded to a first electronic switch unit in order to activate a possible artificial passive fault current on one or more of the active phase conductors and the protective ground conductor (as a return conductor), this fault current being able to actually flow and be recognized as well as be evaluated in a closed circuit in the case of a closed switch contact to be tested and an intact protective ground conductor. According to the control signal pattern preset in the RCMB control, a temporal pattern of switched-on/-off fault current progressions is generated on the electric supply line, the temporal pattern in turn being detected by the measuring current transformer and evaluated in the RCMB control.

Owing to control signal patterns which vary during monitoring, a reliable detection of the artificial passive fault current is ensured even in large dynamic disturbance levels while the electric installation (supply line) to be monitored is in operation.

According to the invention, the amplitude of the switched artificial passive fault current is set such that it can be detected as residual current by the residual current monitoring module, more specifically by the RCMB control of the residual current monitoring module, but does not trigger a fault current protective device (RCD) installed in the electric supply line.

The size of the artificial passive fault current ranges preferably between 200 µA and 3.500 µA and therefore lies below the triggering value (triggering threshold) of a fault current protective device (RCD). This range consequently also lies below an admissible protective ground conductor current and below an admissible touch current.

If such an artificial passive fault current is detected, then it indicates that a functional protective ground conductor is present and a mains voltage is supplied at the respective active conductor, ergo the switch contact to be monitored is in a closed state and the protective ground conductor is intact. A signaling device communicates that the intact protective ground conductor and the mains voltage are present.

To this extent, it can be asserted depending on the aim of the monitoring task whether the switch contact to be monitored is in fact open functionally and consequently no fault current is flowing or, should the switch contact be closed for operational reasons, whether the protective ground conductor has been interrupted.

The invention thus leads to an increased electrical safety by means of the proposed monitoring and enables reducing the number and cost of the components as well as the required space and energy consumption.

In a further embodiment, the RCMB control comprises a fault current comparator which compares a fault current progression detected by the measuring current transformer to the fault current progression expected due to the control signal pattern in order to reliably detect the switched artificial passive fault current.

As a switch-on/-off pattern for the fault current to be switched is predetermined by the RCMB control by means of the control signal pattern, the artificial fault current can be reliably distinguished from actual unwittingly occurring fault currents or other disturbance sources. Only if the detected fault current progression matches the fault current progression expected due to the control signal pattern will the detected fault current be deemed as an indication for a present voltage and ergo for a closed switch contact and an intact protective ground conductor.

In further beneficial embodiments the fault current control unit is configured for generating a first control signal to a second electronic switch unit in order to switch an artificial trigger current for triggering the fault current protective device and/or the system control is designed for generating a second control signal to the second electronic switch unit in order to switch an artificial trigger current for triggering the fault current protective device.

In order to force a fault current protective device installed in the supply line to trigger an artificial fault current and thus to separate the user from the mains infrastructure, an artificial trigger current, which leads to the triggering of this fault current protective device, is generated by the fault current control unit or by the system control.

With regard to recognizing a protective ground conductor interruption, a reliable isolation of the supply line or a switching off of connected users from the overall system can be ensured without any further switching-off devices.

With added benefit, the first electronic switch unit comprises three electronic switches assigned one to each corresponding active phase conductor in order to switch an artificial passive fault current for each of the three active phase conductors.

In this embodiment, a separate fault current is switched in the case of a three-phase supply line for each of the active phase conductors, the fault current being recognized by the measuring current transformer and being evaluated by the RCMB control. The information can be forwarded to a superordinate system control in the form of a fault signal.

Beneficially, the RCMB control comprises a measuring device for measuring mains frequency and/or for detecting the direction of the rotating magnetic field by means of suitable control signal patterns on the active phase conductors.

By using a control signal pattern different for each of the active phase conductors, a mains frequency can be measured and/or the direction of a rotating magnetic field can be recognized.

Alternatively to the separated switch of the artificial passive fault currents for each of the three active phase conductors, the first electronic switch unit comprises exactly one electronic switch which switches a common artificial passive fault current for the three active phase conductors in a three-phase supply line. In this embodiment, all three phase conductors are taken into consideration such that the possible fault current flows simultaneously via all three phase conductors.

The object of the invention is further attained by a method according to the invention for recognizing a closed switch contact as well as a protective ground conductor interruption in a one- or multiphase electric supply line having active conductors and a protective ground conductor.

The method according to the invention forms the basis for realizing the above by means of the electric switch device according to the invention.

In this respect, the benefits and technical effects mentioned above apply to the method according to the invention in the same manner.

BRIEF DESCRIPTION OF THE DRAWING FIGURES

Further beneficial features of the embodiments can be taken from the following description and the drawings which describe a preferred embodiment of the invention by means of examples.

Figure 2:
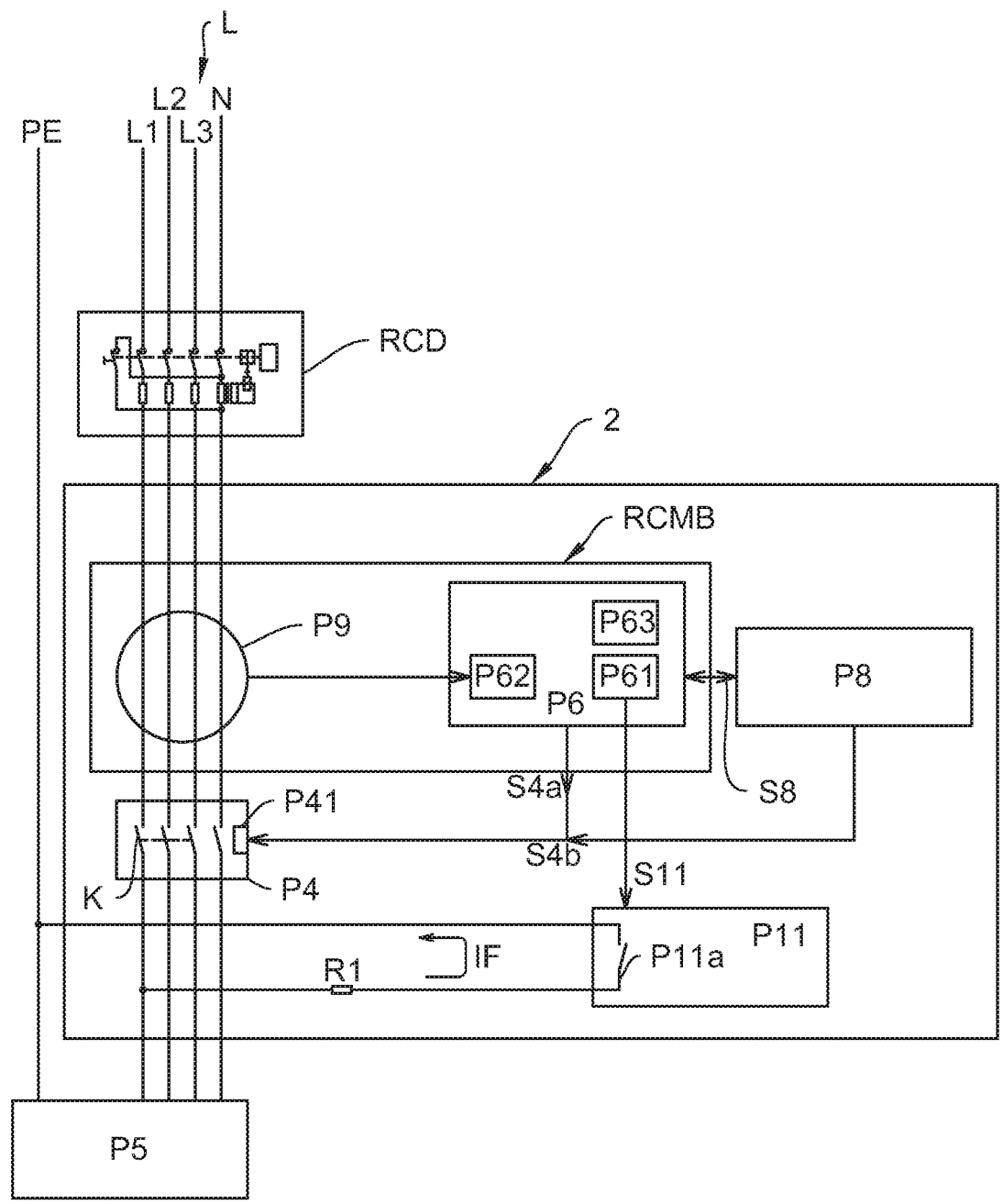
Figure 3:
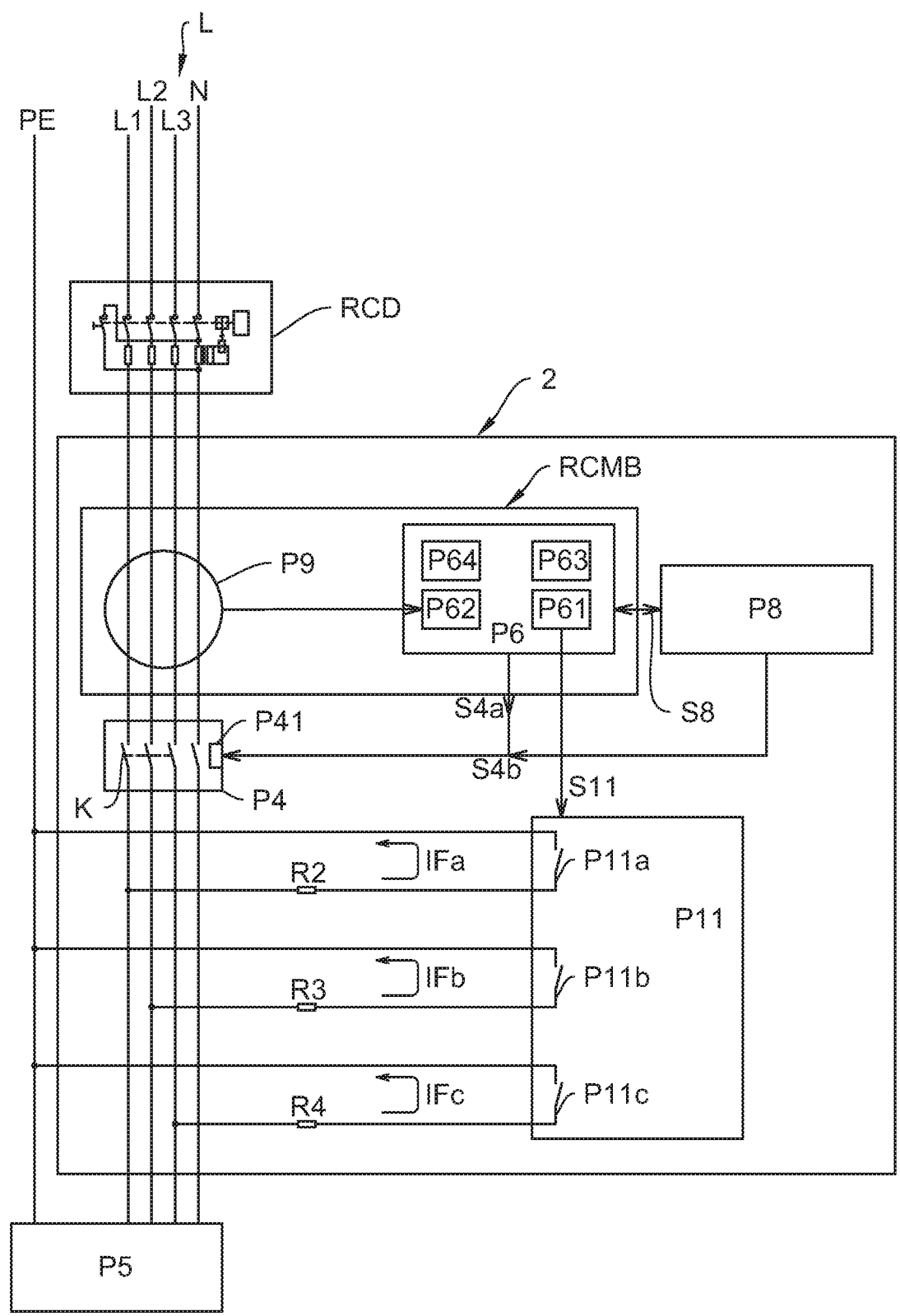
Figure 4:
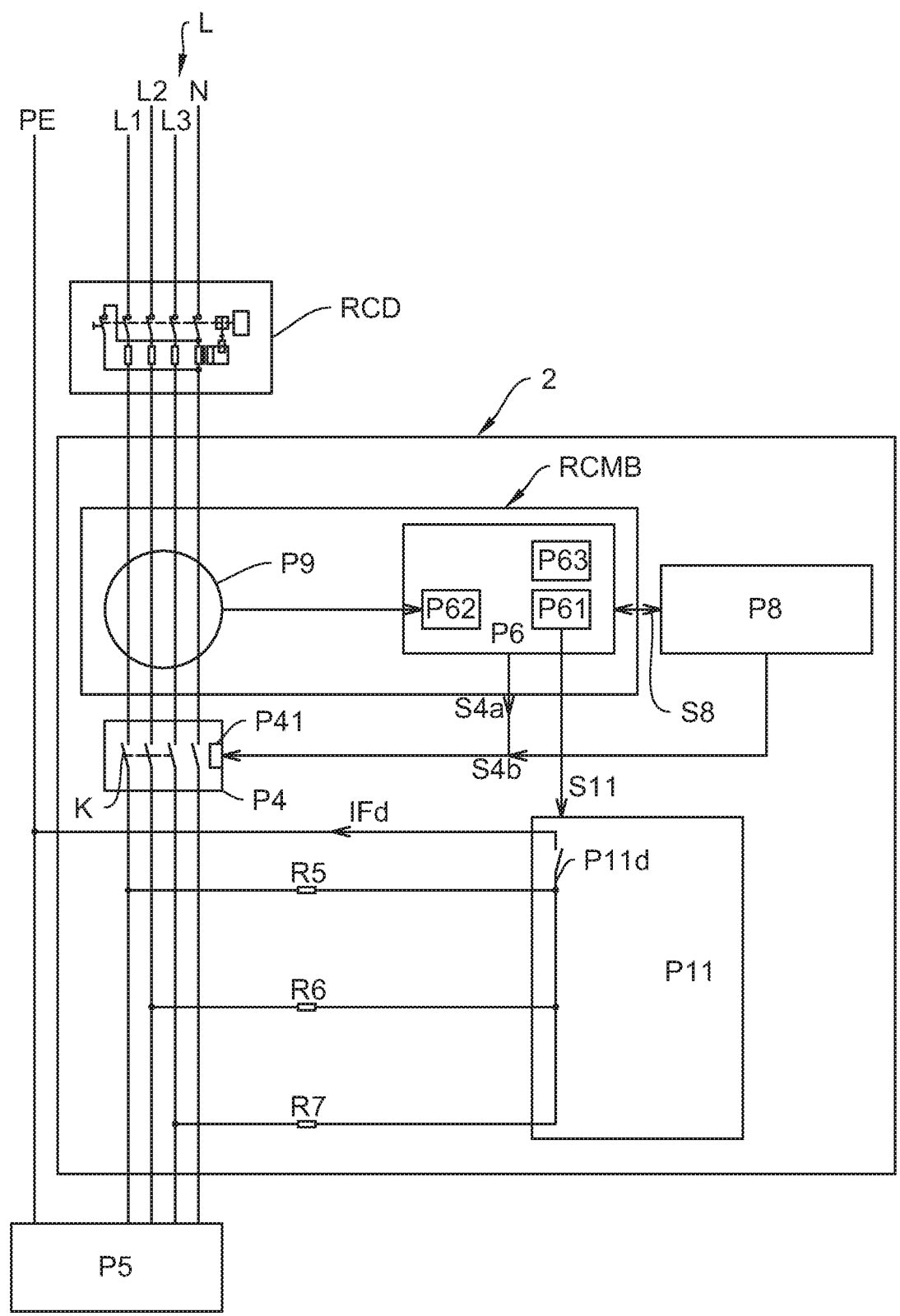
Figure 5:
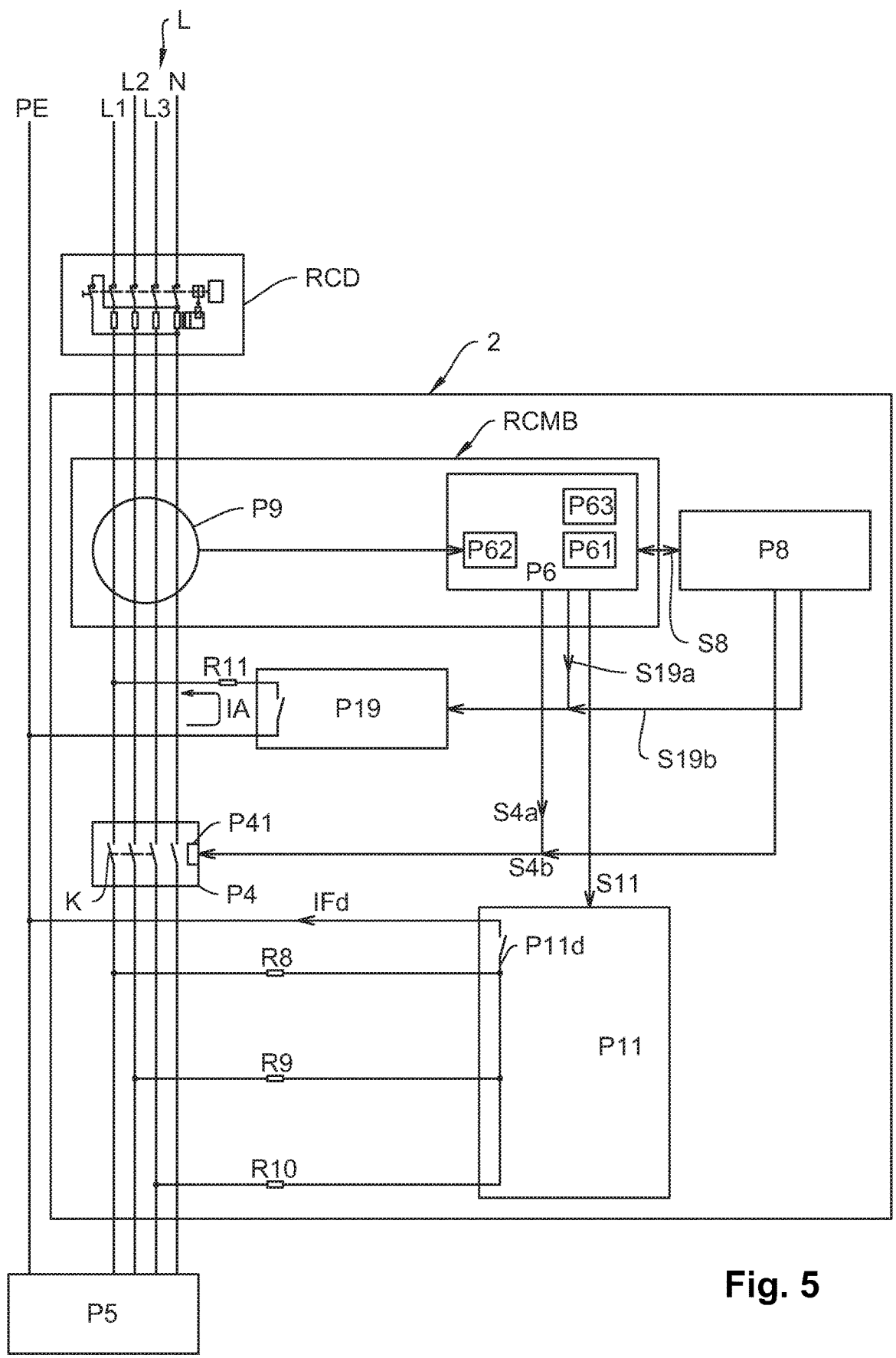
Figure 6:
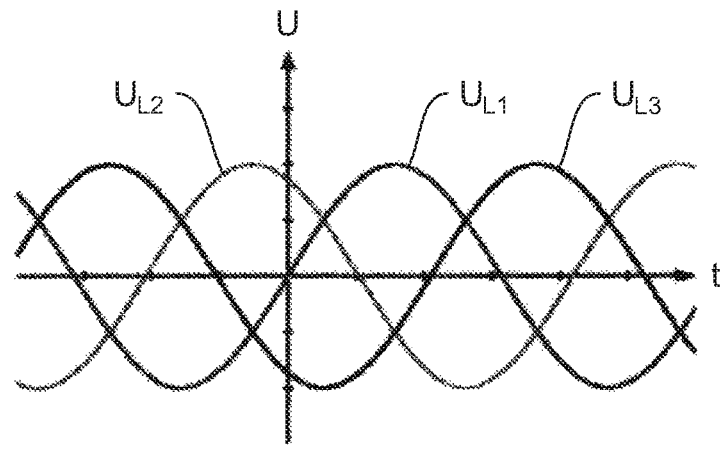
Figure 6:
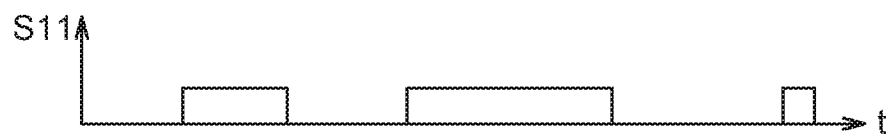
Figure 6:
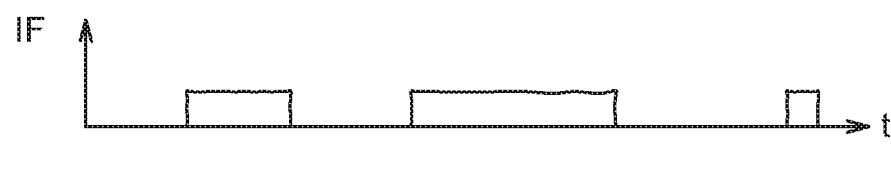
Figure 6:
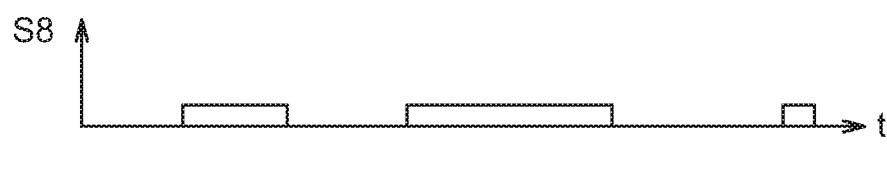

FIG. 1 illustrates electric protective devices according to the state of the art for an electric supply line, FIG. 2 illustrates an electric circuit device according to the invention for a phase conductor, FIG. 3 illustrates an electric circuit device according to the invention for three-phase conductors, FIG. 4 illustrates an electric circuit device according to the invention for three-phase conductors (variation), FIG. 5 illustrates an electric circuit device according to the invention and to FIG. 4 having two electronic switch units and FIG. 6 illustrates a temporal progression of an artificial passive fault current.

DETAILED DESCRIPTION

FIG. 1 illustrates electric protective devices according to the state of the art for a three-phase electric supply line L and corresponds essentially to a standard configuration for monitoring using a modular residual current monitoring device (residual current monitoring module RCMB).

Supply line L has three phase conductors L1, L2, L3 and a neutral conductor N as active conductors and a protective ground conductor PE. Furthermore, supply line L is protected by means of a fault current protective device RCD which separates a user P5 from the power supply should a fault current exceed the trigger value of fault current protective device RCD, the trigger value (rated fault current) being over 6 mA as a rule.

Residual current monitoring module RCMB and a switching-off device P4 are connected between fault current protective device RCD and user P5.

Residual current monitoring module RCMB has a measuring current transformer P9 which detects a residual current on supply line L and forwards a measuring signal for evaluation to RCMB control P6. The evaluation result is forwarded to a superordinate system control P8 in the form of a fault signal S8. Both RCMB control P6 and system control P8 each generate a switching-off signal S4a, S4b which controls switching-off device P4 which separates supply line L.

Switching-off device P4 comprises switch contacts K which serve to separate supply line L and whose functional opening behavior is to be monitored.

FIG. 2 illustrates an electric circuit device 2 according to the invention for a phase conductor L1 of supply line L.

An arrangement having a three-phase supply line L is illustrated, although electric circuit device 2 can be used in a similar manner in a one-phase supply line L for recognizing a closed switch contact K of a switching-off device P4 and for recognizing a protective ground conductor interruption.

According to the invention, RCMB control P6 is enhanced with a fault current control device P61 which generates a control signal pattern S11 which controls a first electronic switch unit P11. According to transmitted control signal pattern S11, the first electronic switch unit P11 switches a fault current IF via a current limiting resistance R1, fault current IF flowing via phase conductor L1 and protective ground conductor PE. This fault current IF is detected by measuring current transformer P9 and is evaluated in RCMB control P6. The control signal pattern generated in fault current control unit P61 causes the first electronic switch unit P11 to switch fault current IF either on or off according to preset control signal pattern S11. If a fault current IF corresponding to this control signal pattern S11 is detected by measuring current transformer P9 and if a fault current comparator P62 determines that this detected fault current IF corresponds to generated control signal pattern S11, then fault current IF is considered recognized. This in turn is considered an indication that a phase conductor voltage (mains voltage) UL1 (cf. FIG. 6) exists on conductor L1, ergo switch contact K to be monitored of switching-off device P4 is (still) closed. If corresponding switch contact K is to be open for operational reasons, a non-functional (opening) behavior of this switch contact K has thus been recognized. If, however, switch contact K is supposed to be closed for operational reasons, the recognition of the fault current—equivalent to the existence of a mains voltage—can be interpreted as an intact protective ground conductor connection PE being present.

In FIG. 3, an electric circuit device 2 according to the invention is illustrated for a three-phase supply line L.

As an enhancement of circuit device 2 from FIG. 2 according to the invention, the first electronic switch unit P11 is enhanced to the extent that it comprises three electronic switches P11a, P11b, P11c assigned one to each corresponding active phase conductor L1, L2, L3 in order to separately switch an artificial passive fault current IFa, IFb, IFc for each of the three active phase conductors L1, L2, L3 via respective current limiting resistances R2, R3, R4.

This embodiment also enables individually generating a control pattern signal S11 and thus an individually flowing fault current for each active phase conductor L1, L2, L3. In addition, a frequency can be measured and/or a direction of a rotating magnetic field can be recognized on respective phase conductors L1, L2, L3 by using suitable control signal patterns S11.

FIG. 4 illustrates an electric circuit device 2 according to the invention for three-phase supply line L in a variation.

Starting from the embodiment according to FIG. 3, the first electronic switch unit P11 has been simplified to the extent that it comprises only one switch P11d which simultaneously switches a fault current IFd flowing for all active phase conductors L1, L2, L3 via respective current limiting resistances R5, R6, R7.

FIG. 5 illustrates an electric circuit device according to the invention for three-phase supply line L according to the variation according to FIG. 4 which is enhanced by a second electronic switch unit P19.

The second electronic switch unit P19 receives a first control signal S19a from fault current control unit P61 and/or a second control signal S19b from system control P8 in order to switch a trigger current IA via a current limiting resistance R11. In contrast to fault current IFd switched in the first electronic switch unit P11 via current limiting resistances R8, R9, R10, this trigger current IA is significantly larger so that it causes fault current protective device RCD to be triggered. Assuming that a functional protective ground conductor PE has been recognized previously, supply line L can be reliably isolated.

Similar to the variation according to FIG. 4, the arrangement can be enhanced by the second electronic switch unit P19 by individually generating control signal pattern S11 according to FIG. 3.

This enhancement by the second electronic switch unit P19 can take place in conjunction with a one-phase supply line L.

FIG. 6 schematically illustrates how artificial passive fault current IF is generated.

Part a of FIG. 6 illustrates the progression of phase conductor voltages UL1, UL2, UL3. Part b illustrates the temporal progression of a control signal pattern S11 generated by fault current control unit P61 of RCMB control P6. Part c of FIG. 6 illustrates a progression of switched fault current IF corresponding to rectangular pattern S11. This fault current IF is detected by means of measuring current transformer P9 and is evaluated in RCMB control P6 using fault current comparator P62, a corresponding fault signal S8 being generated. If this fault signal S8 correlates to control signal pattern S11—in particular with regard to its temporal progression—, as easily seen by comparing Part b and Part c of FIG. 6 to each other, it can be presumed that purposefully generated artificial passive fault current IF is actually flowing. On the one hand, it can then be proven that switch contact K to be tested is still closed and that protective ground conductor PE is functional.

The invention claimed is:

1. An electric circuit device (2) for detecting a closed switch contact (K) of a switching-off device (P4) as well as for recognizing a protective ground conductor interruption in a one or multiphase electric supply line (L) having active conductors (L1, L2, L3, N) and a protective ground conductor (PE), having a residual current monitoring module (RCMB) which comprises a RCMB control (P6) for evaluating a measuring signal supplied by a measuring current transformer (P9) and for generating a first switching-off signal (S4a), the measuring current transformer (P9) capturing residual current flowing on the supply line (L), and having a system control (P8) for generating a second switching-off signal (S4b), the switching-off device (P4) being configured for separating the active conductors (L1, L2, L3, N) and comprising a signal input (P41) for receiving the first switching-off signal (S4a) and the second switching-off signal (S4b), and the system control (P8) being connected to the RCMB control (P6) of the residual current monitoring module (RCMB) for receiving a fault signal (S8), characterized in that the RCMB control (P6) comprises a fault current control unit (P61) for generating a control signal pattern (S11) which controls a first electronic switch unit (P11) for switching an artificial passive fault current (IF) flowing via one or more of the active conductors (L1, L2, L3, N) and the protective ground conductor (PE), the switched artificial passive fault current (IF) being settable such that it is detected as a residual current by the RCMB module but does not trigger a fault current protective device (RCD) installed in the supply line (L), and the RCMB control (P6) comprising a signaling device (P63) which signals detecting the artificial passive fault current (IF) and thus the presence of the functional protective ground conductor (PE) as well as a mains voltage (UL1, UL2, UL3), wherein the RCMB control (P6) comprises a fault current comparator (P62) which compares a fault current progression detected by the measuring current transformer (P9) to the fault current progression expected due to the control signal pattern (S11) in order to reliably detect the switched artificial passive fault current (IF).

2. The electric circuit device (2) according to claim 1, wherein the fault current control unit (P61) is configured for generating a first control signal (S19a) to a second electronic switch unit (P19) in order to switch an artificial trigger current (IA) for triggering the fault current protective device (RCD), provided that the functional protective ground conductor (PE) was recognized previously.

3. The electric circuit device (2) according to claim 1, wherein the system control (P8) which is configured for generating a second control signal (S19b) to a/the second electronic switch unit (P1 9) in order to switch an/the artificial trigger current (IA) for triggering the fault current protective device (RCD).

4. The electric circuit device (2) according to claim 1, wherein the first electronic switch unit (P11) has three electronic switches (P11 a, P11b, P11c) in the instance of a three-phase supply line (L), one electronic switch (P11 a, P11b, P11c) being assigned to each active phase conductor (L1, L2, L3) in order to separately switch an artificial passive fault current (IFa, IFb, IFc) for each of the three active phase conductors (L1, L2, L3).

5. The electric circuit device (2) according to claim 4, wherein the RCMB control (P6) comprises a measuring device (P64) for measuring the mains frequency or for detecting the direction of a rotating magnetic field by means of suitable control signal patterns (S11) on the active phase conductors (L1, L2, L3).

6. The electric circuit device (2) according to claim 1, wherein the first electronic switch unit (P11) comprises an electronic switch (P11d) in the case of a three-phase supply line (L), the electronic switch (P11d) switching a common artificial passive fault current (IFd) for the three active phase conductors (L1, L2, L3).

7. A method for detecting a closed switch contact (K) of a switching-off device (P4) as well as for recognizing a protective ground conductor interruption in a one or multi-phase electric supply line (L) having active conductors (L1, L2, L3, N) and a protective ground conductor (PE), the supply line being equipped with a residual current monitoring module (RCMB) which comprises a RCMB control (P6) for evaluating a measuring signal supplied by a measuring current transformer (P9) and for generating a first switching-off signal (S4a), the measuring current transformer (P9) capturing a residual current flowing on the supply line (L), and the supply line being equipped with the switching-off device (P4) for separating the active conductors (L1, L2, L3, N) and with a system con- trol (P8) for generating a second switching-off signal (S4b), comprising:

generating a control signal pattern (S11) in a fault current control unit (P61) of the RCMB control (P6), controlling a first electronic switch unit (P11) using the control signal pattern (S11) for switching an artificial passive fault cur- rent (IF) which flows via one or more of the active conductors (L1, L2, L3, N) and the protective ground conductor (PE), setting the switched artificial passive fault current (IF) such that it is detected as a residual current by the RCMB module but does not trigger a fault current protective device installed in the supply line (L), signaling a detected artificial passive fault current (IF);

comparing a fault current progression detected by the measuring current transformer (P9) to the fault current progression expected due to the control signal pattern (S11) by means of a fault current comparator (P62) in the RCMB control (P6) in order to reliably detect the switched artificial passive fault current (IF).

8. The method according to claim 7, further including separating the active conductors (L1, L2, L3, N) by means of the switching-off device (P4) via the first switching-off signal (S4a) or the second switching-off signal (S4b) if the artificial passive fault current (IF) is signaled.

9. The method according to claim 7, further including generating a first control signal (S19a) to a second electronic switch unit (P19) by means of the fault current control unit (P61) in order to switch an artificial trigger current (IA) for triggering the fault current protective device (RCD), provided that the functioning protective ground conductor was recognized.

10. The method according to claim 7, further including generating a second control signal (S19b) to a/the second electronic switch unit (P19) by means of the system control (P8) in order to switch an/the artificial trigger current (IA) for triggering the fault current protective device (RCD).

11. The method according to claim 7, wherein, in the case of a three- phase supply line (L), an artificial passive fault current (IFa, IFb, IFc) is switched separately for each of the three active phase conductors (L1, L2, L3), one electronic switch (P11 a, P11b, P11c) being assigned to each active phase conductor (L1, L2, L3) in the first electronic switch unit (P11).

12. The method according to claim 11, further including measuring a mains frequency and/or detecting a direction of a rotating magnet- is field in a measuring device (P64) of the RCMB control (P6) by means of suitable control signal patterns (S11) on the active phase conductor (L1, L2, L3).

13. The method according to claim 7, wherein, in the event of a three-phase supply line (L) a shared artificial passive fault current (IFd) flowing via the protective conductor is switched for the three active phase conductors (L1, L2, L3) by means of exactly one electronic switch (P11d).

* * * * *